United States Patent
Kanada et al.

(10) Patent No.: US 11,067,637 B2
(45) Date of Patent: Jul. 20, 2021

(54) APPARATUS AND METHOD OF ESTIMATING STATE OF LITHIUM ION BATTERY

(71) Applicant: TOYOTA JIDOSHA KABUSHIKI KAISHA, Toyota (JP)

(72) Inventors: Ryo Kanada, Toyota (JP); Koji Umemura, Okazaki (JP); Akemi Nakatake, Nagoya (JP)

(73) Assignee: TOYOTA JIDOSHA KABUSHIKI KAISHA, Toyota (JP)

(\*) Notice: Subject to any disclaimer, the term of this patent is extended or adjusted under 35 U.S.C. 154(b) by 195 days.

(21) Appl. No.: 15/958,723

(22) Filed: Apr. 20, 2018

(65) Prior Publication Data
US 2018/0340984 A1 Nov. 29, 2018

(30) Foreign Application Priority Data
May 26, 2017 (JP) .............................. JP2017-104872

(51) Int. Cl.
*H01M 10/48* (2006.01)
*G01R 31/392* (2019.01)
*H01M 10/052* (2010.01)
*H02J 7/14* (2006.01)
*H01M 10/0525* (2010.01)
*H01M 50/20* (2021.01)
*G01R 31/389* (2019.01)
(Continued)

(52) U.S. Cl.
CPC ........ *G01R 31/392* (2019.01); *H01M 10/052* (2013.01); *H01M 10/0525* (2013.01); *H01M 10/484* (2013.01); *H01M 10/486* (2013.01); *H01M 50/20* (2021.01); *H02J 7/14* (2013.01);

*G01R 31/367* (2019.01); *G01R 31/374* (2019.01); *G01R 31/389* (2019.01); *H01M 10/443* (2013.01); *H01M 2010/4271* (2013.01); *H01M 2220/20* (2013.01); *H02J 7/0049* (2020.01)

(58) Field of Classification Search
CPC ................................................... H01M 10/484
See application file for complete search history.

(56) References Cited

U.S. PATENT DOCUMENTS

| | | | |
|---|---|---|---|
| 2014/0129163 A1* | 5/2014 | Betzner | H01M 10/486 702/63 |
| 2015/0147614 A1* | 5/2015 | Wang | G01R 31/3835 429/93 |
| 2018/0074132 A1* | 3/2018 | Day | H01M 10/486 |

FOREIGN PATENT DOCUMENTS

JP 2009-199936 A 9/2009

\* cited by examiner

*Primary Examiner* — Jeremiah R Smith
(74) *Attorney, Agent, or Firm* — Sughrue Mion, PLLC

(57) ABSTRACT

A control device calculates an amount of increase $\Delta Am$ in freezing temperature measurement value Am from an initial freezing temperature $\Delta 0$ and calculates an amount of lowering in capacity corresponding to the amount of increase $\Delta Am$ in freezing temperature as an amount of lowering in capacity $\Delta Bx$ due to deterioration of a material. The control device calculates an amount of lowering in capacity measurement value Bm from an initial capacity B0 as a whole amount of lowering in capacity $\Delta Bm$ and calculates a material deterioration ratio X by using $\Delta Bx$ and $\Delta Bm$. The control device calculates a value resulting from subtraction of $\Delta Bx$ from $\Delta Bm$ as an amount of lowering in capacity $\Delta By$ due to precipitation of Li and calculates an Li precipitation deterioration ratio Y by using $\Delta By$ and $\Delta Bm$.

4 Claims, 11 Drawing Sheets

(51) Int. Cl.
*H02J 7/00* (2006.01)
*H01M 10/44* (2006.01)
*G01R 31/374* (2019.01)
*H01M 10/42* (2006.01)
*G01R 31/367* (2019.01)

FIG.5

| FACTOR FOR LOWERING IN CAPACITY | PHENOMENON | |
|---|---|---|
| | CONCENTRATION OF SALT | FREEZING TEMPERATURE A |
| DETERIORATION OF MATERIAL | LOWERING ⇒ | INCREASE |
| PRECIPITATION OF LITHIUM | NOT LOWERED | NOT LOWERED |

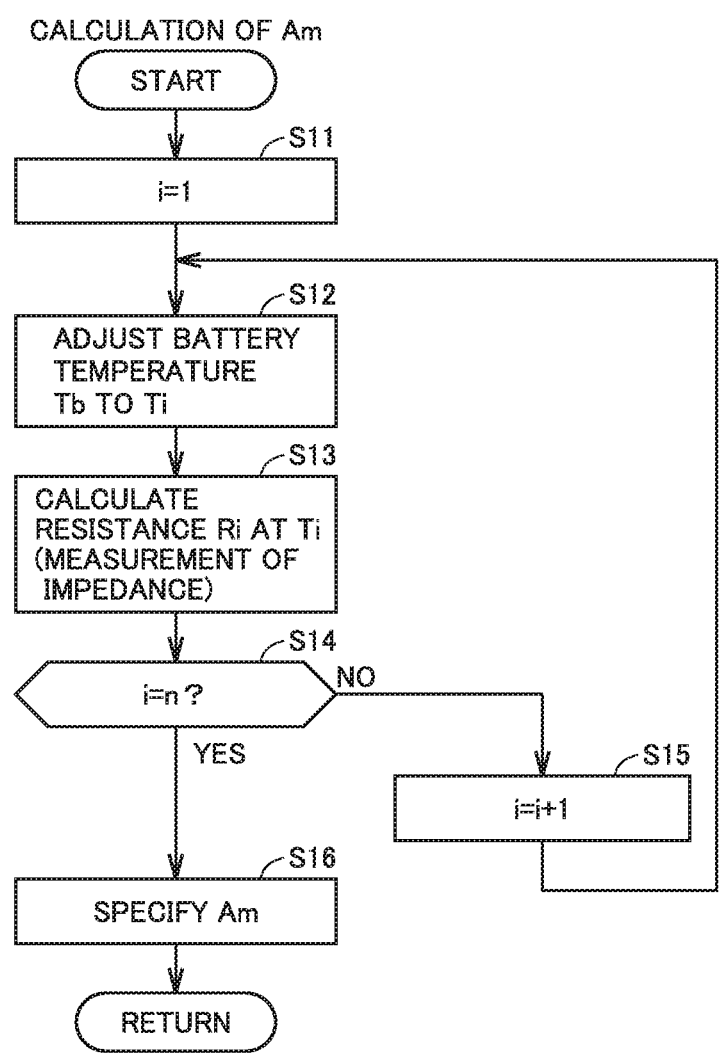

APPARATUS AND METHOD OF ESTIMATING STATE OF LITHIUM ION BATTERY

This nonprovisional application is based on Japanese Patent Application No. 2017-104872 filed with the Japan Patent Office on May 26, 2017, the entire contents of which are hereby incorporated by reference.

BACKGROUND

Field

The present disclosure relates to a technique of estimating a state of deterioration of a lithium ion battery.

Description of the Background Art

Japanese Patent Laying-Open No. 2009-199936 describes calculation of an amount of lithium which precipitates at a negative electrode of a lithium ion battery based on charging and discharging history information which represents a history of charging and discharging of the lithium ion battery.

SUMMARY

A full charge capacity (which is hereinafter simply also referred to as a "capacity") of a lithium ion battery lowers due to deterioration of a material (deterioration of a coating of a negative electrode, destruction of a structure of an active material, or deterioration of an electrolyte) and precipitation of lithium at a negative electrode. Therefore, it is important to know an amount of lowering in capacity in order to estimate a state of deterioration of a lithium ion battery.

Even though an amount of lowering in capacity is the same, however, characteristics (for example, an amount of lowering in capacity in the future or a rate of lowering in capacity) of a lithium ion battery are different depending on whether lowering in capacity is caused by deterioration of a material or precipitation of lithium. Therefore, from a point of view of control of charging and discharging or recycling of a battery, it is important not only simply to know a whole amount of lowering in capacity but also to accurately estimate a ratio of an amount of lowering in capacity due to deterioration of a material to a whole amount of lowering in capacity (which is hereinafter also referred to as a "material deterioration ratio") and a ratio of an amount of lowering in capacity due to precipitation of lithium to the whole amount of lowering in capacity (which is hereinafter also referred to as a "precipitation deterioration ratio").

With the technique disclosed in Japanese Patent Laying-Open No. 2009-199936, an amount of precipitation of lithium of a lithium ion battery can be calculated by using charging and discharging history information. The charging and discharging history information, however, contains an error. Therefore, when the lithium ion battery is used for a long period of time, errors are accumulated for the long period of time and accuracy in calculation of an amount of precipitation of lithium is lowered.

The present disclosure was made to solve the above-described problems and an object is to accurately calculate a material deterioration ratio and a precipitation deterioration ratio of a lithium ion battery.

(1) An apparatus which estimates a state of a lithium ion battery according to the present disclosure includes a first calculator configured to calculate a measurement value of a freezing temperature of an electrolyte of the lithium ion battery, a second calculator configured to calculate a measurement value of a capacity of the lithium ion battery, and an estimator configured to estimate a state of the lithium ion battery. The estimator calculates at least one of a material deterioration ratio representing a ratio of an amount of lowering in capacity due to deterioration of a material to a whole amount of lowering in capacity of the lithium ion battery and a precipitation deterioration ratio representing a ratio of an amount of lowering in capacity due to precipitation of lithium to the whole amount of lowering in capacity, by using the measurement value of the freezing temperature and the measurement value of the capacity.

In studying a technique of solving the above-described problems, the inventors of the present application have noted such characteristics that an amount of increase in freezing temperature (solidification point) of an electrolyte of a lithium ion battery correlates with deterioration of a material but does not correlate with precipitation of lithium. Specifically, a freezing temperature of an electrolyte increases with lowering in concentration of salt in the electrolyte. When the material deteriorates, the concentration of salt is lowered and the freezing temperature increases. On the other hand, when lithium is precipitated, the concentration of salt hardly lowers and the freezing temperature is hardly varied. Therefore, though the amount of increase in freezing temperature correlates with the amount of lowering in capacity due to deterioration of a material, it does not correlate with the amount of lowering in capacity due to precipitation of lithium.

With attention being paid to such characteristics, the estimator according to the configuration calculates at least one of the material deterioration ratio and the precipitation deterioration ratio by using a measurement value of the freezing temperature and a measurement value of the capacity. Thus, the material deterioration ratio can be calculated, for example, by calculating an amount of lowering in capacity corresponding to an amount of increase in freezing temperature (that is, an amount of lowering in capacity due to deterioration of a material) by using a measurement value of the freezing temperature and by calculating a whole amount of lowering in capacity by using a measurement value of the capacity. Furthermore, the precipitation deterioration ratio can also be calculated by calculating a value resulting from subtraction of the amount of lowering in capacity due to deterioration of a material from the whole amount of lowering in capacity as an amount of lowering in capacity due to precipitation of lithium. Consequently, at least one of the material deterioration ratio and the precipitation deterioration ratio can accurately be calculated without using the charging and discharging history information (information in which errors are accumulated with lapse of a period of use).

(2) In one embodiment, the apparatus further includes a storage which stores in advance information representing correspondence between the capacity and the freezing temperature when lithium is not precipitated but the material has deteriorated. The estimator is configured to calculate a first amount of lowering in capacity corresponding to a difference between the measurement value of the freezing temperature and an initial freezing temperature by referring to the information stored in the storage, calculate a difference between the measurement value of the capacity and an initial capacity as a second amount of lowering in capacity, and calculate a value resulting from division of the first amount of lowering in capacity by the second amount of lowering in capacity as the material deterioration ratio.

According to the configuration, the material deterioration ratio can be calculated by using the information stored in the storage, the measurement value of the freezing temperature, and the measurement value of the capacity. Specifically, information representing correspondence between the capacity and the freezing temperature when lithium is not precipitated but the material has deteriorated is stored in advance in the storage. Therefore, the first amount of lowering in capacity corresponding to a difference between the measurement value of the freezing temperature and the initial freezing temperature (a freezing temperature of a new product), that is, the amount of lowering in capacity due to deterioration of a material, can readily be calculated by referring to the information stored in the storage. The material deterioration ratio can be calculated by dividing the amount of lowering in capacity due to deterioration of a material by the second amount of lowering in capacity (the whole amount of lowering in capacity).

(3) In one embodiment, the estimator is configured to calculate a value resulting from division of a third amount of lowering in capacity by the second amount of lowering in capacity as the precipitation deterioration ratio, the third amount of lowering in capacity resulting from subtraction of the first amount of lowering in capacity from the second amount of lowering in capacity.

According to the configuration, the precipitation deterioration ratio can be calculated with a simplified technique of dividing the third amount of lowering in capacity (the amount of lowering in capacity due to precipitation of lithium) by the second amount of lowering in capacity, the third amount of lowering in capacity resulting from subtraction of the first amount of lowering in capacity (the amount of lowering in capacity due to deterioration of a material) from the second amount of lowering in capacity (the whole amount of lowering in capacity).

(4) In one embodiment, the first calculator is configured to sequentially measure an impedance of the lithium ion battery with a temperature of the lithium ion battery being increased and lowered. The first calculator is configured to specify a temperature at which hysteresis of a resistance of the lithium ion battery exhibited with variation in temperature starts to appear by using a result of measurement of the impedance, and define the temperature at which hysteresis of the resistance starts to appear as the measurement value of the freezing temperature.

In studying a technique of measuring a freezing temperature, the inventors of the present application have found such characteristics that hysteresis is exhibited in variation in resistance of a lithium ion battery during decrease and increase in temperature of the battery while an electrolyte is frozen, and noted these characteristics. Specifically, the first calculator according to the configuration sequentially measures an impedance of the lithium ion battery with a temperature being increased and decreased, specifies a temperature at which hysteresis of a resistance of the lithium ion battery exhibited with variation in temperature starts to appear by using a result of measurement of the impedance, and defines the temperature at which hysteresis of resistance starts to appear as the measurement value of the freezing temperature. The freezing temperature of the lithium ion battery can thus accurately be specified.

(5) A method of estimating a state of a lithium ion battery according to the present disclosure includes calculating a measurement value of a freezing temperature of an electrolyte of the lithium ion battery, calculating a measurement value of a capacity of the lithium ion battery, and calculating at least one of a material deterioration ratio representing a ratio of an amount of lowering in capacity due to deterioration of a material to a whole amount of lowering in capacity of the lithium ion battery and a precipitation deterioration ratio representing a ratio of an amount of lowering in capacity due to precipitation of lithium to the whole amount of lowering in capacity, by using the measurement value of the freezing temperature and the measurement value of the capacity.

In the method of estimating a state as well, at least one of the material deterioration ratio and the precipitation deterioration ratio of a lithium ion battery can accurately be calculated similarly to the apparatus which estimates a state.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a diagram which summarizes relation of factors for lowering in capacity with a concentration of salt and freezing temperature A.

FIG. 11 is a flowchart (No. 2) showing one example of the procedure of processing in the control device.

DESCRIPTION OF THE PREFERRED EMBODIMENTS

Figure 1:
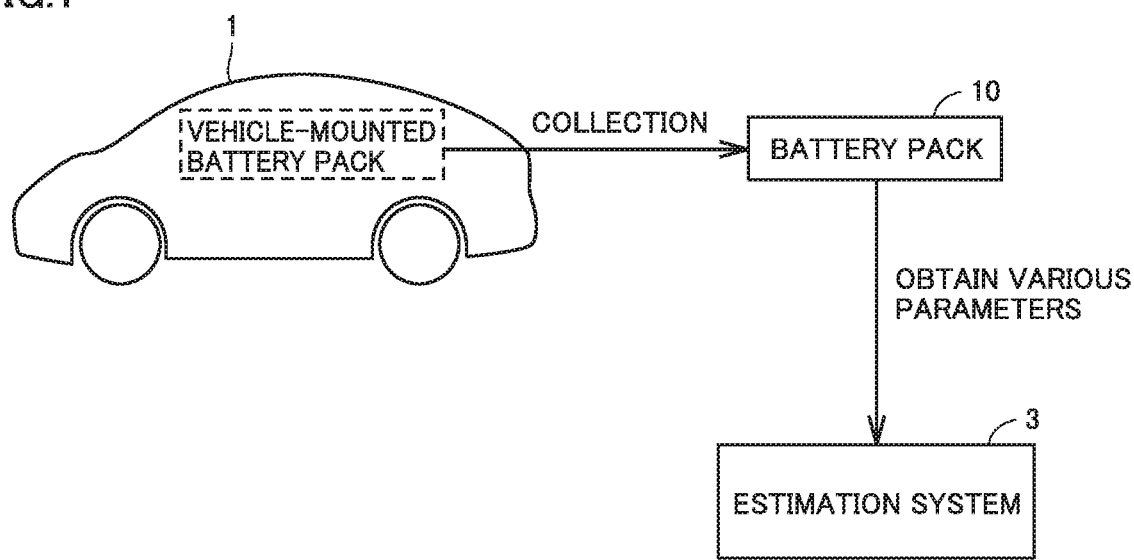
FIG. 1 is a diagram schematically showing an overall configuration of a system which estimates a state of deterioration of a lithium ion secondary battery.

An embodiment of the present disclosure will be described below in detail with reference to the drawings. The same or corresponding elements in the drawings have the same reference characters allotted and description thereof will not be repeated.

<Overall Configuration of System>

FIG. 1 is a diagram schematically showing an overall configuration of a system which estimates a state of deterioration of a lithium ion secondary battery 10. An example in which lithium ion secondary battery 10 is employed as a battery pack to be mounted on a vehicle will be described below by way of example. Applications of the lithium ion secondary battery, however, are not limited to vehicle-mount applications. The lithium ion secondary battery is not limited to a battery pack and may be a cell.

A vehicle 1 is a hybrid vehicle, an electric vehicle, or a fuel cell vehicle. Lithium ion secondary battery 10 which stores electric power for running is mounted on vehicle 1. Lithium ion secondary battery 10 is implemented by a battery pack in which lithium ion cells are combined, and includes a plurality of cells 11 (see FIG. 2). Lithium ion secondary battery 10 is removed from vehicle 1 and collected at a dealer (a distributor) or a service garage.

Collected lithium ion secondary battery 10 is placed in an estimation system 3 and a state of deterioration thereof is estimated by estimation system 3. Lithium ion secondary battery 10 determined as being recyclable based on a state of deterioration estimated by estimation system 3 is mounted on another vehicle or recycled as a secondary battery for stationary use in a factory, a house, or a store.

Figure 2:
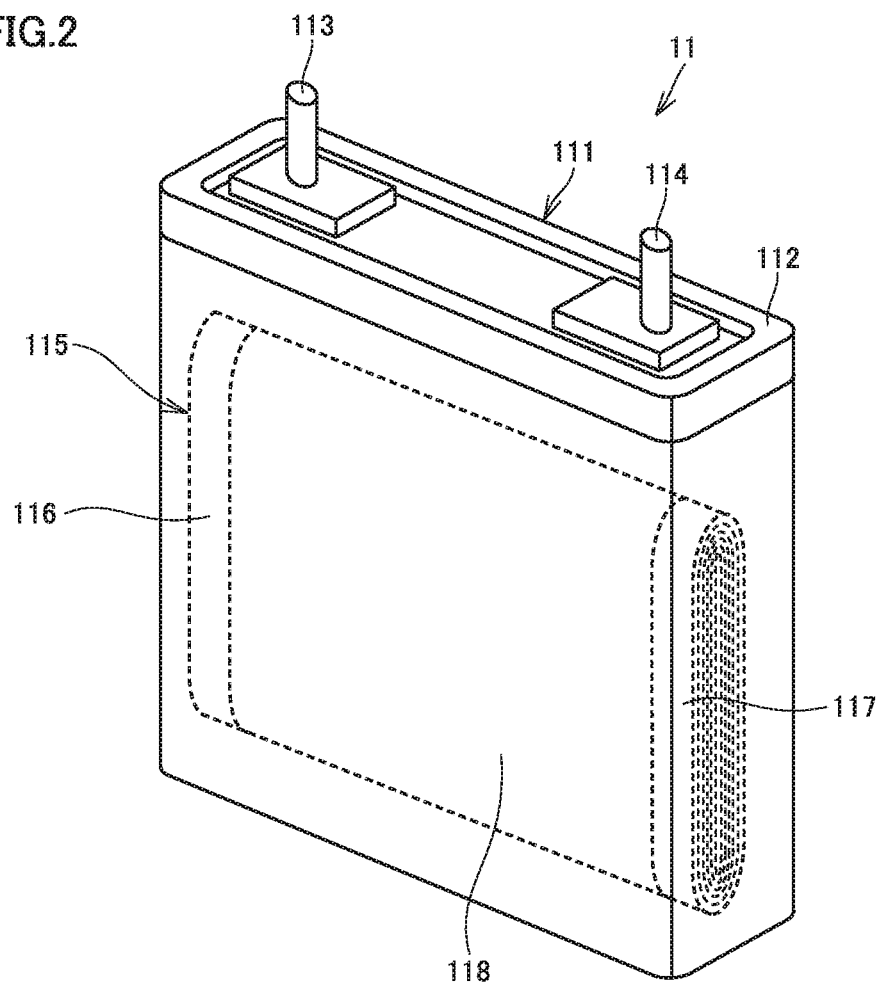
FIG. 2 is a diagram showing one example of a configuration of each cell included in the lithium ion secondary battery.

FIG. 2 is a diagram showing one example of a configuration of each cell 11 included in lithium ion secondary battery 10. Though FIG. 2 shows an example in which each cell 11 is in a prismatic shape, each cell 11 may be in any shape such as a cylindrical shape.

An upper surface of a case 111 of cell 11 is sealed by a lid 112. A positive electrode terminal 113 and a negative electrode terminal 114 are provided in lid 112. Positive electrode terminal 113 and negative electrode terminal 114 have one ends protruding from lid 112 to the outside, respectively. Positive electrode terminal 113 and negative electrode terminal 114 have the other ends electrically connected to an internal positive electrode terminal and an internal negative electrode terminal, respectively (neither of which is shown).

An electrode assembly 115 is accommodated in case 111 (as shown with a dashed line in FIG. 2 with case 111 being seen through). Electrode assembly 115 is formed, for example, by winding like a cylinder, stacked positive electrode sheet 116 and negative electrode sheet 117 with a separator 118 being interposed. It is not essential to form electrode assembly 115 as a wound element, and electrode assembly 115 may be a stack which is not wound.

Positive electrode sheet 116 includes a current collection foil and a positive electrode active material layer formed on a surface of the current collection foil. Similarly, negative electrode sheet 117 includes a current collection foil and a negative electrode active material layer formed on a surface of the current collection foil. Separator 118 is provided as being in contact with both of the positive electrode active material layer and the negative electrode active material layer. Electrode assembly 115 is impregnated with an electrolyte.

Conventionally known various materials can be used for a positive electrode active material, a negative electrode active material, separator 118, and an electrolyte. By way of example, a layered ternary system of nickel, cobalt, and manganese (NCM) is employed as the positive electrode active material. A graphite based material is employed as the negative electrode active material. A porous film made, for example, of polyethylene (PE) is employed for separator 118. An electrolyte contains an organic solvent, lithium salt, and an additive.

<Estimation of State of Deterioration of Lithium Ion Secondary Battery>

A full charge capacity (which is hereinafter simply also referred to as a "capacity B") of lithium ion secondary battery 10 lowers due to deterioration of a material (deterioration of a coating of a negative electrode, destruction of a structure of an active material, or deterioration of an electrolyte) and precipitation of lithium (Li) at a negative electrode. Therefore, it is important to know an amount of lowering in capacity B in order to estimate a state of deterioration of lithium ion secondary battery 10.

Even though an amount of lowering in capacity B is the same, however, characteristics (for example, an amount of lowering in capacity in the future or a rate of lowering in capacity) of lithium ion secondary battery 10 are different depending on whether lowering in capacity is caused by deterioration of a material or precipitation of lithium. Therefore, from a point of view of control of charging and discharging or recycling of lithium ion secondary battery 10, it is important not only simply to know a whole amount of lowering in capacity but also to accurately estimate a ratio of an amount of lowering in capacity due to deterioration of a material to the whole amount of lowering in capacity (which is hereinafter also referred to as a "material deterioration ratio X") and a ratio of an amount of lowering in capacity due to precipitation of lithium to the whole amount of lowering in capacity (which is hereinafter also referred to as a "precipitation deterioration ratio Y").

In view of the aspect above, estimation system 3 according to the present embodiment calculates a measurement value of a freezing temperature A of an electrolyte of lithium ion secondary battery 10 (which is hereinafter simply also referred to as a "freezing temperature measurement value Am") and calculates a measurement value of capacity B of lithium ion secondary battery 10 (which is hereinafter simply also referred to as a "capacity measurement value Bm"). Estimation system 3 calculates material deterioration ratio X and Li precipitation deterioration ratio Y by using freezing temperature measurement value Am and capacity measurement value Bm.

Figure 3:
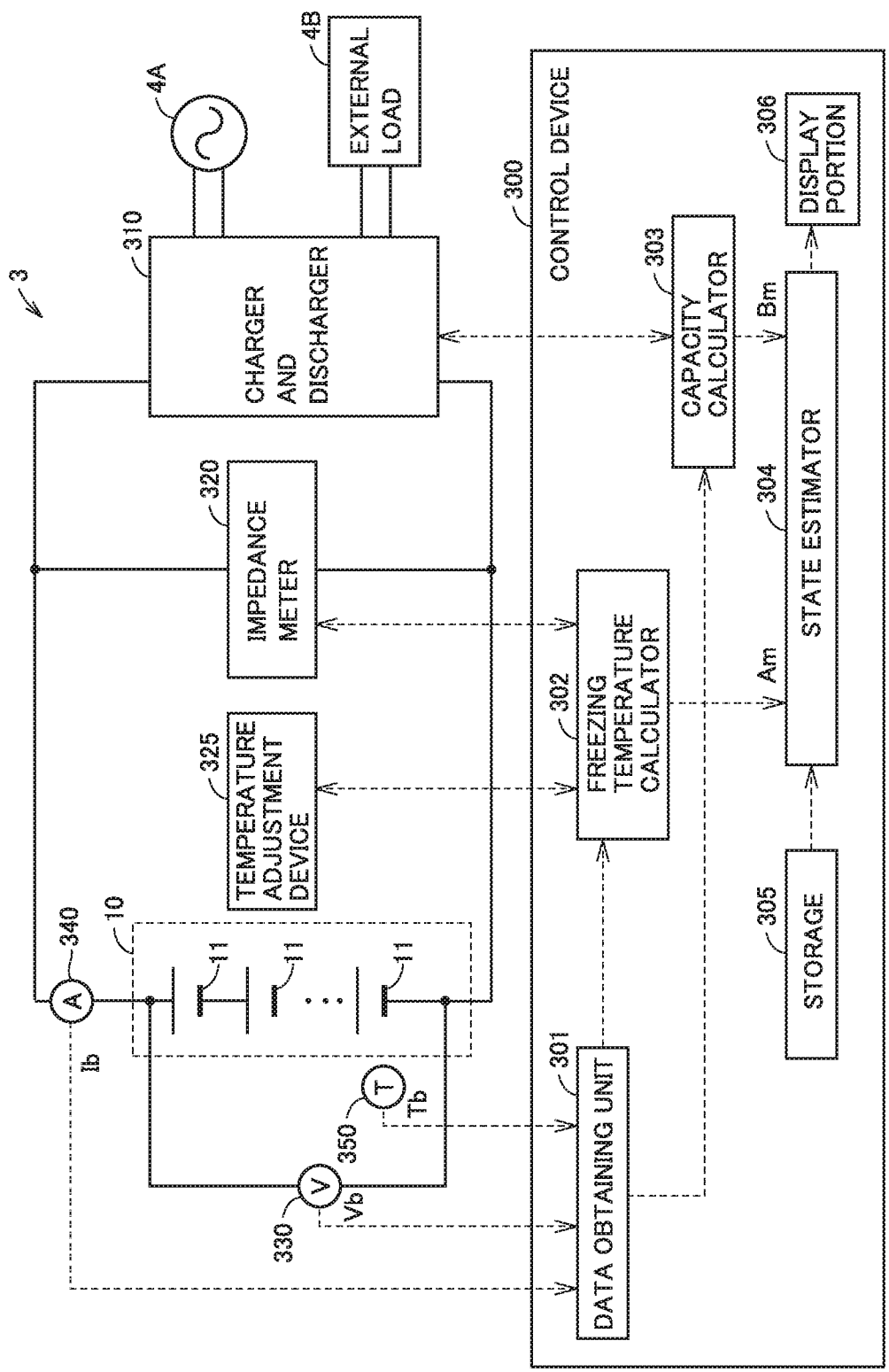
FIG. 3 is a diagram schematically showing one example of a configuration of the estimation system shown in FIG. 1.

FIG. 3 is a diagram schematically showing one example of a configuration of estimation system 3 shown in FIG. 1. Estimation system 3 is configured such that lithium ion secondary battery 10 collected from vehicle 1 can be placed therein.

Estimation system 3 includes a control device 300, a charger and discharger 310, an impedance meter 320, a temperature adjustment device 325, a voltage sensor 330, a current sensor 340, and a temperature sensor 350.

Charger and discharger 310 is configured to be able to charge lithium ion secondary battery 10 or have lithium ion secondary battery 10 discharge. Specifically, charger and discharger 310 converts alternating-current (AC) power supplied from an external power supply (for example, a system power supply) 4A into direct-current (DC) power in response to a charging command from control device 300 to charge lithium ion secondary battery 10. Alternatively, charger and discharger 310 has lithium ion secondary battery 10 discharge electric power stored therein to an external load 4B in response to a discharging command from control device 300.

Impedance meter 320 calculates a resistance (a charge transfer resistance) R of lithium ion secondary battery 10 with an AC impedance method in response to a command from control device 300 (or an operation by a user). Specifically, impedance meter 320 sequentially applies AC signals at a plurality of frequencies included in a prescribed range across electrodes of lithium ion secondary battery 10, measures a response signal across the electrodes each time of application of the AC signal at each frequency, and performs processing for calculating a real number component and an imaginary number component of the impedance for each combination between the applied AC signal and the measured response signal and plotting the components on the abscissa and the ordinate of a two-dimensional coordinate (what is called a Cole-Cole plot). Impedance meter 320 calculates resistance R of lithium ion secondary battery 10 from an impedance circle obtained in the Cole-Cole plot (see FIG. 9 which will be described later). Since a technique of calculating resistance R with the AC impedance method per se has been known, detailed description thereof will not be repeated.

Temperature adjustment device 325 adjusts a temperature Tb of lithium ion secondary battery 10 by cooling or heating lithium ion secondary battery 10 in response to a command from control device 300 (or an operation by a user). A known temperature adjuster can be employed for temperature adjustment device 325.

Voltage sensor 330 detects a voltage Vb of lithium ion secondary battery 10 (which may be each cell 11 or a module constituted of a plurality of cells 11). Current sensor 340 detects a current Ib input to and output from lithium ion secondary battery 10. Temperature sensor 350 detects temperature Tb of lithium ion secondary battery 10. Each sensor outputs a signal indicating a result of detection to control device 300.

Control device 300 includes a data obtaining unit 301, a freezing temperature calculator 302, a capacity calculator 303, a state estimator 304, a storage 305, and a display portion 306.

Data obtaining unit 301 obtains a signal indicating a result of detection by each sensor (voltage sensor 330, current sensor 340, and temperature sensor 350) and outputs the signal to freezing temperature calculator 302 and capacity calculator 303.

Freezing temperature calculator 302 calculates freezing temperature measurement value Am by controlling impedance meter 320 and temperature adjustment device 325 by using information from data obtaining unit 301. A specific technique of calculating freezing temperature measurement value Am will be described in detail later.

Capacity calculator 303 calculates capacity measurement value Bm by controlling charger and discharger 310 by using information from data obtaining unit 301. A known technique can be used as a specific technique of calculating capacity measurement value Bm. For example, capacity measurement value Bm can be calculated by having lithium ion secondary battery 10 discharge at a constant current until voltage Vb of lithium ion secondary battery 10 is varied from a value exhibiting a fully charged state to a value exhibiting an empty state and by integrating currents Ib of lithium ion secondary battery 10 during that period.

State estimator 304 calculates a whole amount of lowering in capacity $\Delta Bm$, an amount of lowering in capacity $\Delta Bx$ due to deterioration of a material, and an amount of lowering in capacity $\Delta By$ due to precipitation of Li by using freezing temperature measurement value Am calculated by freezing temperature calculator 302, capacity measurement value Bm calculated by capacity calculator 303, and information stored in storage 305. State estimator 304 calculates a ratio of amount of lowering in capacity $\Delta Bx$ due to deterioration of a material to whole amount of lowering in capacity $\Delta Bm$ (that is, material deterioration ratio X) and a ratio of amount of lowering in capacity $\Delta By$ due to precipitation of Li to whole amount of lowering in capacity $\Delta Bm$ (that is, Li precipitation deterioration ratio Y). A more detailed technique of calculating material deterioration ratio X and Li precipitation deterioration ratio Y will be described in detail later.

State estimator 304 estimates a state of deterioration of lithium ion secondary battery 10 (an amount of lowering in capacity in the future or a rate of lowering in capacity) by using material deterioration ratio X and Li precipitation deterioration ratio Y as well as information stored in storage 305.

Storage 305 stores various types of information used for processing by state estimator 304. Display portion 306 is implemented, for example, by a display and shows a result of processing by state estimator 304. A user can check a state of lithium ion secondary battery 10 shown on display portion 306 and determine a future application of lithium ion secondary battery 10.

Freezing temperature calculator 302, capacity calculator 303, and state estimator 304 may be configured as individually divided operation processors or as a single operation processor. Freezing temperature calculator 302, capacity calculator 303, and state estimator 304 may be described below as control device 300 without being distinguished from one another.

<Calculation of Material Deterioration Ratio X and Li Precipitation Deterioration Ratio Y>

In studying a technique of calculating material deterioration ratio X and Li precipitation deterioration ratio Y, the inventors of the present application have noted such characteristics that an amount of increase in freezing temperature A correlates with deterioration of a material but does not correlate with precipitation of lithium.

Figure 4:
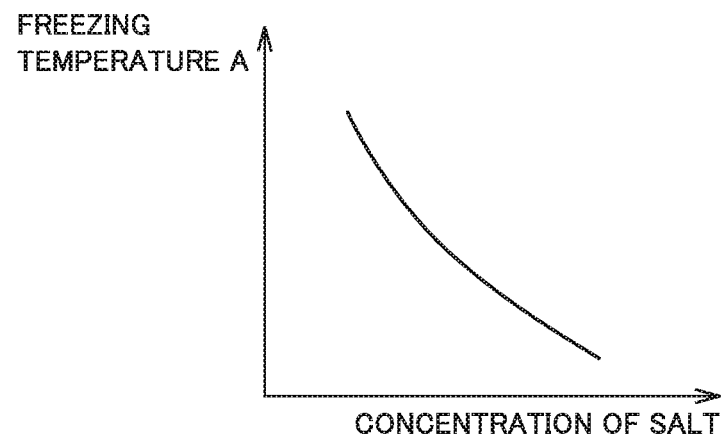
FIG. 4 is a diagram schematically showing correspondence between a concentration of salt in an electrolyte and a freezing temperature A of the lithium ion secondary battery.

FIG. 4 is a diagram schematically showing correspondence between a concentration of salt in an electrolyte and freezing temperature A of lithium ion secondary battery 10. As shown in FIG. 4, as a concentration of salt in the electrolyte is lower, freezing temperature A is higher. Therefore, it can be understood that freezing temperature A has such characteristics as increasing with lowering in concentration of salt in the electrolyte.

FIG. 5 is a diagram which summarizes relation of factors for lowering in capacity with a concentration of salt and freezing temperature A. When lowering in capacity is caused by deterioration of a material, a concentration of salt in the electrolyte lowers. Freezing temperature A increases with lowering in concentration of salt (see FIG. 4 described above). When lowering in capacity is caused by precipitation of lithium, a concentration of salt in the electrolyte hardly lowers and hence freezing temperature A hardly varies. Therefore, it can be concluded that an amount of increase in freezing temperature A has such characteristics as correlating with the amount of lowering in capacity due to deterioration of a material but not correlating with the amount of lowering in capacity due to precipitation of lithium.

By making use of such characteristics, control device 300 according to the present embodiment calculates material deterioration ratio X and Li precipitation deterioration ratio Y by using freezing temperature measurement value Am, capacity measurement value Bm, and information stored in storage 305.

Figure 6:
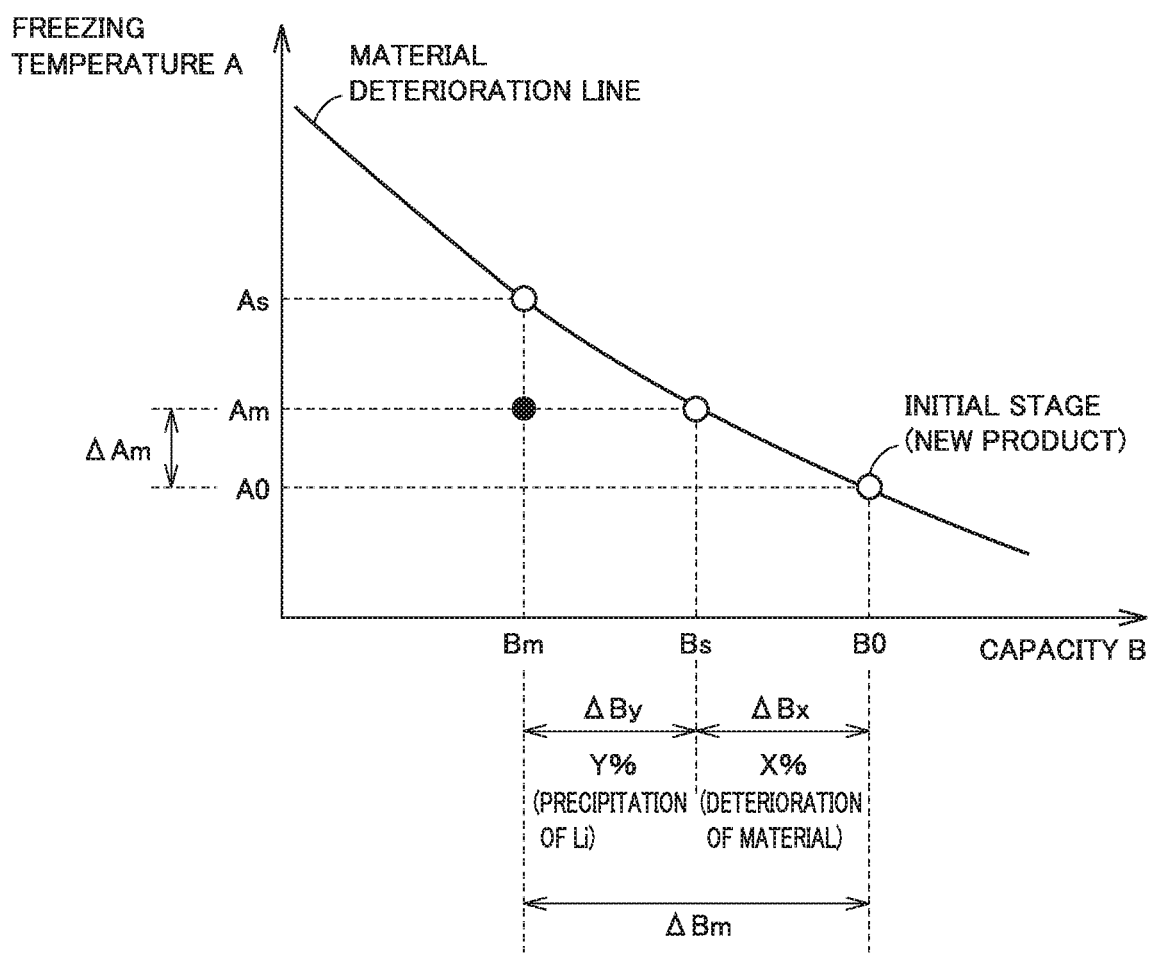
FIG. 6 is a diagram showing information (a material deterioration line) representing correspondence between a capacity B and freezing temperature A when Li is not precipitated but a material has deteriorated.

FIG. 6 is a diagram showing information (which is hereinafter also referred to as a "material deterioration line") showing correspondence between capacity B and freezing temperature A when Li is not precipitated but a material has deteriorated (that is, material deterioration ratio X is 100%). The material deterioration line is found in advance through experiments or the like and stored in storage 305.

A technique of calculating material deterioration ratio X and Li precipitation deterioration ratio Y will be described with reference to FIG. 6. In FIG. 6, a difference (=|Bm−B0|)

between capacity measurement value Bm and an initial capacity B0 corresponds to a whole amount of lowering in capacity ΔBm. Initial capacity B0 refers to capacity B of a new product and stored in storage 305 together with the material deterioration line. In FIG. 6, a difference (=|Am−A0|) between freezing temperature measurement value Am and an initial freezing temperature A0 corresponds to a freezing temperature increase amount ΔAm. Initial freezing temperature A0 refers to freezing temperature A of a new product and stored in storage 305 together with the material deterioration line.

If it is assumed that whole amount of lowering in capacity ΔBm is totally caused by deterioration of a material, relation between capacity measurement value Bm and freezing temperature A follows the material deterioration line and hence freezing temperature A must attain to an estimated freezing temperature $A_s$ found from the material deterioration line and capacity measurement value Bm.

In the example shown in FIG. 6, however, actual freezing temperature measurement value Am is lower than estimated freezing temperature $A_s$. This may be because of the above-described characteristics, that is, such characteristics that an amount of increase in freezing temperature A correlates with deterioration of a material but does not correlate with precipitation of lithium. According to these characteristics, an amount of lowering in capacity corresponding to freezing temperature increase amount ΔAm (=|Am−A0|), that is, a difference (=|Bs−B0|) between an estimated capacity $B_s$ found from the material deterioration line and freezing temperature measurement value Am and initial capacity B0, corresponds to amount of lowering in capacity ΔBx due to deterioration of a material. A value resulting from subtraction (=|ΔBm−ΔBx|) of amount of lowering in capacity ΔBx due to deterioration of a material from whole amount of lowering in capacity ΔBm corresponds to amount of lowering in capacity ΔBy due to precipitation of Li.

Control device 300 calculates an amount of lowering in capacity corresponding to freezing temperature increase amount ΔAm by referring to the material deterioration line and defines the calculated amount of lowering in capacity as an "amount of lowering in capacity ΔBx due to deterioration of a material" (a first amount of lowering in capacity). Control device 300 calculates a difference between capacity measurement value Bm and initial capacity B0 as "whole amount of lowering in capacity ΔBm" (a second amount of lowering in capacity). Control device 300 calculates a value resulting from subtraction of amount of lowering in capacity ΔBx due to deterioration of a material from whole amount of lowering in capacity ΔBm as "amount of lowering in capacity ΔBy due to precipitation of Li" (a third amount of lowering in capacity).

Control device 300 calculates a value resulting from division of amount of lowering in capacity ΔBx due to deterioration of a material by whole amount of lowering in capacity ΔBm as material deterioration ratio X and calculates a value resulting from division of amount of lowering in capacity ΔBy due to precipitation of Li by whole amount of lowering in capacity ΔBm as Li precipitation deterioration ratio Y.

Figure 7:
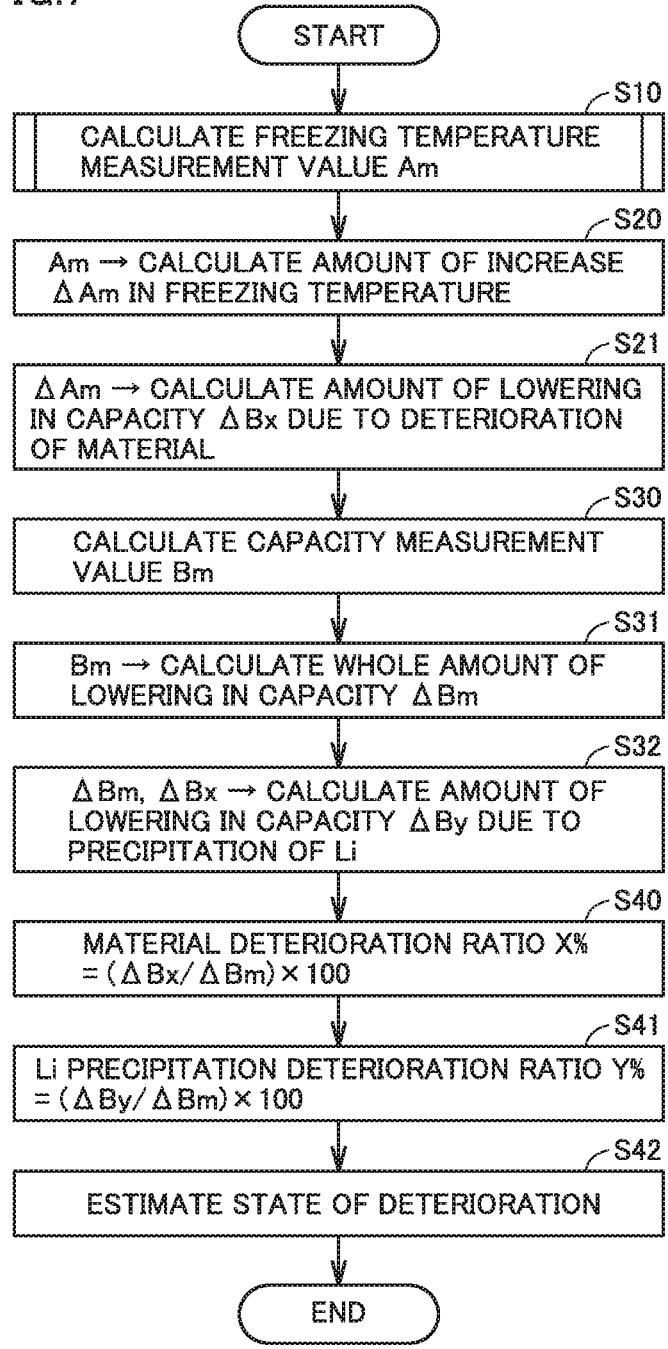
FIG. 7 is a flowchart (No. 1) showing one example of a procedure of processing in a control device.

FIG. 7 is a flowchart showing one example of a procedure of processing performed when control device 300 calculates material deterioration ratio X and Li precipitation deterioration ratio Y.

Initially, control device 300 calculates "freezing temperature measurement value Am" (step S10). A specific technique of calculating freezing temperature measurement value Am will be described in detail later.

Then, control device 300 reads initial freezing temperature A0 stored in storage 305 (see FIG. 6) and calculates a difference (=|Am−A0|) between freezing temperature measurement value Am and initial freezing temperature A0 as "freezing temperature increase amount ΔAm" (step S20).

Then, control device 300 calculates an amount of lowering in capacity corresponding to freezing temperature increase amount ΔAm by referring to the material deterioration line stored in storage 305 (see FIG. 6) and defines the calculated amount of lowering in capacity as "amount of lowering in capacity ΔBx due to deterioration of a material" (step S21).

Then, control device 300 calculates capacity measurement value Bm by controlling charger and discharger 310 (step S30). As described above, a known technique can be used as a specific technique of calculating capacity measurement value Bm.

Then, control device 300 reads initial capacity B0 stored in storage 305 (see FIG. 6) and calculates a difference (=|Bm−B0|) between capacity measurement value Bm and initial capacity B0 as "whole amount of lowering in capacity ΔBm" (step S31).

Then, control device 300 calculates a value resulting from subtraction of amount of lowering in capacity ΔBx due to deterioration of a material from whole amount of lowering in capacity ΔBm as "amount of lowering in capacity ΔBy due to precipitation of Li" (step S32).

Then, control device 300 calculates material deterioration ratio X (%) by using an expression (1) below (step S40).

$$\text{Material deterioration ratio } X=(\Delta Bx/\Delta Bm)\times 100 \qquad (1)$$

Then, control device 300 calculates Li precipitation deterioration ratio Y (%) by using an expression (2) below (step S41).

$$\text{Li precipitation deterioration ratio } Y=(\Delta By/\Delta Bm)\times 100 \qquad (2)$$

Then, control device 300 estimates a state of deterioration of lithium ion secondary battery 10 by using material deterioration ratio X and Li precipitation deterioration ratio Y calculated in steps S40 and S41 (step S42).

Figure 8:
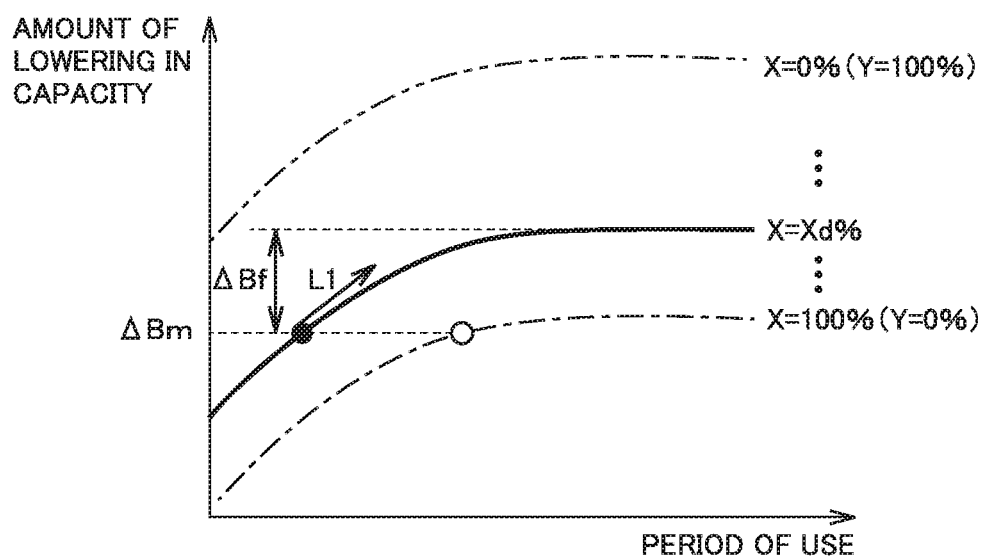
FIG. 8 is a diagram schematically showing correspondence between a period of use and an amount of lowering in capacity of a lithium ion secondary battery.

FIG. 8 is a diagram schematically showing correspondence between a period of use and an amount of lowering in capacity of lithium ion secondary battery 10. In FIG. 8, the abscissa represents a period of use and the ordinate represents an amount of lowering in capacity. A chain dotted line represents correspondence at the time when material deterioration ratio X is 100% (Li precipitation deterioration ratio Y is 0%). A chain double dotted line represents correspondence at the time when material deterioration ratio X is 0% (Li precipitation deterioration ratio Y is 100%). A solid line represents correspondence at the time when material deterioration ratio X is at "Xd" %, with Xd representing a prescribed value (0<Xd<100).

As shown in FIG. 8, the amount of lowering in capacity increases with a period of use and is soon converged to a prescribed value. Magnitude of amount of lowering in capacity, however, is dependent not only on the period of use but also on material deterioration ratio X (Li precipitation deterioration ratio Y). Specifically, the amount of lowering in capacity is greater as material deterioration ratio X is lower (Li precipitation deterioration ratio Y is higher), in spite of the same period of use.

With this aspect being borne in mind, in the present embodiment, information representing correspondence between a period of use and an amount of lowering in capacity is stored in storage 305 for each material deterioration ratio X (Li precipitation deterioration ratio Y). Control device 300 reads information on correspondence which corresponds to material deterioration ratio X and Li precipitation deterioration ratio Y calculated in steps S40 and S41 from storage 305 and estimates an amount of lowering in capacity ΔBf in the future and a rate of lowering in capacity L1 from the read information on correspondence and whole amount of lowering in capacity ΔBm.

In the example shown in FIG. 8, when material deterioration ratio X calculated in step S40 is Xd % with Xd representing a prescribed value, information on correspondence shown with the solid line is read and amount of lowering in capacity ΔBf in the future and rate of lowering in capacity L1 corresponding to whole amount of lowering in capacity ΔBm are estimated by referring to the read information on correspondence (the solid line). Therefore, the amount of lowering in capacity in the future and the rate of lowering in capacity can be expected more accurately than in an example where correspondence (the chain dotted line), for example, at the time of material deterioration ratio X being 100% is simply used.

<<Calculation of Freezing Temperature Measurement Value Am>>

Details of processing for calculating freezing temperature measurement value Am (processing in step S10 in FIG. 7) will now be described.

In studying a technique of calculating freezing temperature measurement value Am, the inventors of the present application have found such characteristics that hysteresis is exhibited in variation in resistance of lithium ion secondary battery 10 when temperature Tb of lithium ion secondary battery 10 is lowered and increased while an electrolyte of lithium ion secondary battery 10 is frozen and noted these characteristics.

By making use of the characteristics, control device 300 according to the present embodiment calculates freezing temperature measurement value Am in a procedure below. Control device 300 sequentially varies temperature Tb of lithium ion secondary battery 10 to a plurality of predetermined sample temperatures $T_1$ to $T_n$ (n being an integer not smaller than two) by controlling temperature adjustment device 325. Sample temperatures $T_1$ to $T_n$ are set such that temperature Tb is lowered from a room-temperature level to a freezing level at which the electrolyte is expected to completely be frozen and thereafter increased again to the room-temperature level.

Control device 300 calculates resistance R of lithium ion secondary battery 10 based on measurement of an AC impedance with impedance meter 320 each time temperature Tb is adjusted to each of sample temperatures $T_1$ to $T_n$.

Figure 9:
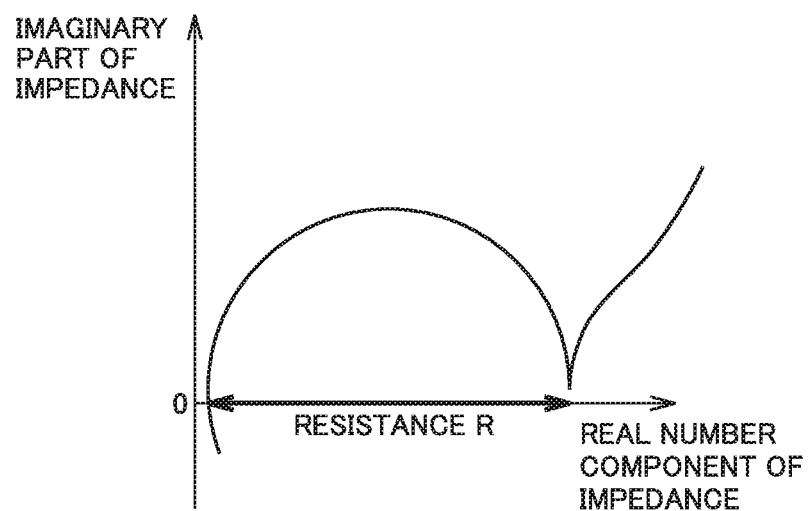
FIG. 9 is a diagram showing one example of a waveform of an impedance locus obtained in a Cole-Cole plot of results of measurement of an AC impedance on a complex plane.

FIG. 9 is a diagram showing one example of an impedance locus obtained in a Cole-Cole plot of results of measurement of an AC impedance on a complex plane. In FIG. 9, the abscissa represents a real number component (a resistive component) of the impedance and the ordinate represents an imaginary number component (a capacitive component) of the impedance. As shown in FIG. 9, a semi-circular locus which is also called an impedance circle appears in a part of the locus of the impedance obtained in the Cole-Cole plot. Control device 300 calculates resistance R of lithium ion secondary battery 10 from this impedance circle. Control device 300 calculates such resistance R each time temperature Tb is adjusted to each of sample temperatures $T_1$ to $T_n$. Therefore, resistances $R_1$ to $R_n$ corresponding to respective sample temperatures $T_1$ to $T_n$ are calculated.

Control device 300 plots respective combinations between sample temperatures $T_1$ to $T_n$ and resistances $R_1$ to $R_n$ on a two-dimensional coordinate of which abscissa represents temperature Tb and ordinate represents resistance R, specifies a temperature at which hysteresis of resistance R exhibited with variation in temperature Tb starts to appear from the locus obtained by plotting, and defines the specified temperature as freezing temperature measurement value Am.

Figure 10:
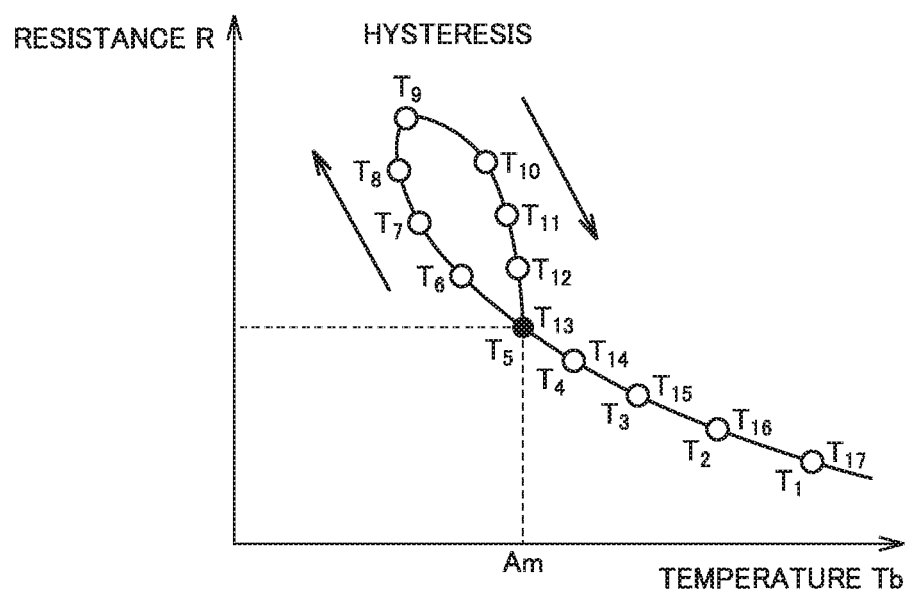
FIG. 10 is a diagram showing one example of a locus obtained by plotting respective combinations between sample temperatures $T_1$ to $T_n$ and resistances R.

FIG. 10 is a diagram showing one example of a locus obtained by plotting respective combinations between sample temperatures $T_1$ to $T_n$ and resistances $R_1$ to $R_n$ on the two-dimensional coordinate. FIG. 10 shows an example in which resistances R are sequentially calculated in the order of sample temperatures $T_1$ to $T_{17}$. An example in which a temperature monotonously decreases from sample temperature $T_1$ to sample temperature $T_8$ ($T_1 > T_2 > T_3 > \ldots > T_8$) and monotonously increases from sample temperature $T_8$ to sample temperature $T_{17}$ ($T_8 < T_9 < T_{10} < T_{11} \ldots < T_{17}$) is shown. Conditions of $T_1 = T_{17}$, $T_2 = T_{16}$, $T_3 = T_{15}$, $T_4 = T_{14}$, and $T_5 = T_{13}$ are set.

It can be understood that hysteresis of resistances R starts to appear at sample temperature $T_5$ ($=T_{13}$) in the locus shown in FIG. 10. In this case, control device 300 calculates temperature $T_5$ ($=T_{13}$) at which hysteresis of resistance R starts to appear as freezing temperature measurement value Am.

FIG. 11 is a flowchart showing one example of the procedure of processing at the time when control device 300 performs processing for calculating freezing temperature measurement value Am (processing in step S10 in FIG. 7).

Initially, control device 300 sets a sample number i to "1" (step S11).

Then, control device 300 adjusts temperature Tb of lithium ion secondary battery 10 to a sample temperature $T_i$ corresponding to sample number i by controlling temperature adjustment device 325 (step S12).

When temperature Tb is adjusted to sample temperature $T_i$, control device 300 calculates a resistance $R_i$ of lithium ion secondary battery 10 at sample temperature $T_i$ based on measurement of an AC impedance with impedance meter 320 (step S13).

When calculation of resistance $R_i$ is completed, control device 300 determines whether or not sample number i has reached a prescribed value n (step S14).

When sample number i has not reached prescribed value n (NO in step S14), control device 300 increments sample number i by 1 (step S15). Thereafter, the process returns to step S12 and control device 300 repeats processing from step S12 to step S15 until sample number i reaches prescribed value n. As described above, sample temperatures $T_1$ to $T_n$ are set such that temperature Tb is lowered from the room-temperature level to the freezing level and thereafter again increased to the room-temperature level. Therefore, by increasing sample number i from 1 to prescribed value n, sample temperature $T_i$ corresponding to sample number i is lowered from the room-temperature level to the freezing level and thereafter increased again to the room-temperature level.

When sample number i has reached prescribed value n (YES in step S14), control device 300 plots respective combinations between sample temperatures $T_1$ to $T_n$ and resistances $R_1$ to $R_n$ on the two-dimensional coordinate as shown in FIG. 10 described above, specifies a temperature at which hysteresis of resistance R exhibited with variation in temperature starts to appear from the locus obtained by plotting, and defines the specified temperature as freezing temperature measurement value Am (step S16).

As set forth above, control device 300 according to the present embodiment calculates material deterioration ratio X and Li precipitation deterioration ratio Y by making use of such characteristics that an amount of increase in freezing temperature A of lithium ion secondary battery 10 correlates with deterioration of a material but does not correlate with precipitation of Li. Specifically, control device 300 calculates freezing temperature increase amount $\Delta Am$ by using freezing temperature measurement value Am, calculates an amount of lowering in capacity corresponding to freezing temperature increase amount $\Delta Am$ (amount of lowering in capacity $\Delta Bx$ due to deterioration of a material) by referring to the material deterioration line (FIG. 6), calculates whole amount of lowering in capacity $\Delta Bm$ by using capacity measurement value Bm, and calculates material deterioration ratio X by using amount of lowering in capacity $\Delta Bx$ due to deterioration of a material and whole amount of lowering in capacity $\Delta Bm$. Control device 300 calculates a value resulting from subtraction of amount of lowering in capacity $\Delta Bx$ due to deterioration of a material from whole amount of lowering in capacity $\Delta Bm$ as amount of lowering in capacity $\Delta By$ due to precipitation of Li, and calculates Li precipitation deterioration ratio Y by using amount of lowering in capacity $\Delta By$ due to precipitation of Li and whole amount of lowering in capacity $\Delta Bm$.

Therefore, in the present embodiment, material deterioration ratio X and Li precipitation deterioration ratio Y can be calculated not by using charging and discharging history information of lithium ion secondary battery 10 (information in which errors are accumulated with lapse of a period of use) but by using freezing temperature measurement value Am and capacity measurement value Bm at a certain time point. Consequently, material deterioration ratio X and Li precipitation deterioration ratio Y can be calculated more accurately than in an example where charging and discharging history information is used.

In the present embodiment, the material deterioration line shown in FIG. 6 (information showing correspondence between capacity B and freezing temperature A when Li is not precipitated but a material has deteriorated) is found through experiments or the like and stored in advance in storage 305. Therefore, an amount of lowering in capacity corresponding to freezing temperature increase amount $\Delta Am$ (that is, amount of lowering in capacity $\Delta Bx$ due to deterioration of a material) can readily be calculated by referring to the material deterioration line stored in storage 305.

Control device 300 according to the present embodiment calculates freezing temperature measurement value Am by making use of such characteristics that hysteresis is exhibited in variation in resistance R exhibited with variation in temperature Tb while the electrolyte of lithium ion secondary battery 10 is frozen. Specifically, an impedance of lithium ion secondary battery 10 is sequentially measured while temperature Tb is increased and lowered, a temperature at which hysteresis starts to appear in variation in resistance R of lithium ion secondary battery 10 exhibited with variation in temperature Tb is specified by using results of measurement of the impedance, and the specified temperature is defined as freezing temperature measurement value Am. Freezing temperature measurement value Am can thus accurately be specified.

Control device 300 according to the present embodiment estimates a state of deterioration of lithium ion secondary battery 10 by using calculated material deterioration ratio X (or Li precipitation deterioration ratio Y) (see FIG. 8). Therefore, a state of deterioration of lithium ion secondary battery 10 (amount of lowering in capacity $\Delta Bf$ in the future or rate of lowering in capacity L1) can be expected more accurately than in an example where material deterioration ratio X (or Li precipitation deterioration ratio Y) is not used (for example, when whole amount of lowering in capacity $\Delta Bm$ alone is simply used).

Though the embodiment described above shows an example in which both of material deterioration ratio X and Li precipitation deterioration ratio Y are calculated, only any one of material deterioration ratio X and Li precipitation deterioration ratio Y may be calculated.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. An apparatus which estimates a state of a lithium ion battery, the apparatus comprising:
   a temperature adjustment device configured to adjust a temperature of the lithium ion battery;
   a charger and discharger configured to charge and discharge the lithium ion battery;
   a display configured to display the state of the lithium ion battery; and
   one or more processors configured to:
      calculate, by controlling the temperature adjustment device, a measurement value of a freezing temperature of an electrolyte of the lithium ion battery;
      calculate, by controlling the charger and discharger, a measurement value of a capacity of the lithium ion battery;
      calculate a material deterioration ratio representing a ratio of an amount of lowering in capacity due to deterioration of a material to a whole amount of lowering in capacity of the lithium ion battery and a precipitation deterioration ratio representing a ratio of an amount of lowering in capacity due to precipitation of lithium to the whole amount of lowering in capacity, by using the measurement value of the freezing temperature and the measurement value of the capacity;
      estimate the state of the lithium ion battery, based on the material deterioration ratio and the precipitation deterioration ratio; and
      control the display to display the state of the lithium ion battery.

2. The apparatus according to claim 1, further comprising:
   a storage which stores in advance information representing correspondence between the capacity and the freezing temperature when lithium is not precipitated but the material has deteriorated, wherein
   the one or more processors are further configured to calculate a first amount of lowering in capacity corresponding to a difference between the measurement value of the freezing temperature and an initial freezing temperature by referring to the information stored in the storage, calculate a difference between the measurement value of the capacity and an initial capacity as a second amount of lowering in capacity, and calculate a value resulting from division of the first amount of lowering in capacity by the second amount of lowering in capacity as the material deterioration ratio.

3. The apparatus according to claim 2, wherein
the one or more processors are further configured to calculate a value resulting from division of a third amount of lowering in capacity by the second amount of lowering in capacity as the precipitation deterioration ratio, the third amount of lowering in capacity resulting from subtraction of the first amount of lowering in capacity from the second amount of lowering in capacity.

4. The apparatus according to claim 1, wherein
the one or more processors are further configured to sequentially measure an impedance of the lithium ion battery with a temperature of the lithium ion battery being increased and lowered, specify a temperature at which hysteresis of a resistance of the lithium ion battery exhibited with variation in temperature starts to appear by using a result of measurement of the impedance, and define the temperature at which hysteresis of the resistance starts to appear as the measurement value of the freezing temperature.

\* \* \* \* \*